United States Patent
Tsutsui et al.

(10) Patent No.: US 7,222,327 B2
(45) Date of Patent: May 22, 2007

(54) PHOTO MASK, METHOD OF MANUFACTURING PHOTO MASK, AND METHOD OF GENERATING MASK DATA

(75) Inventors: Tomohiro Tsutsui, Kawasaki (JP); Osamu Ikenaga, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 397 days.

(21) Appl. No.: 10/864,375

(22) Filed: Jun. 10, 2004

(65) Prior Publication Data

US 2005/0003280 A1   Jan. 6, 2005

(30) Foreign Application Priority Data

Jun. 12, 2003   (JP) ............................. 2003-168127

(51) Int. Cl.
*G06F 17/50* (2006.01)
(52) U.S. Cl. .......................................... 716/21; 716/19
(58) Field of Classification Search .................. 716/19, 716/21; 430/5, 22, 30
See application file for complete search history.

(56) References Cited

U.S. PATENT DOCUMENTS

| | | | |
|---|---|---|---|
| 6,171,731 B1 * | 1/2001 | Medvedeva et al. | 430/5 |
| 6,553,562 B2 * | 4/2003 | Capodieci et al. | 716/19 |
| 6,601,231 B2 * | 7/2003 | LaCour | 716/21 |
| 6,670,081 B2 * | 12/2003 | Laidig et al. | 430/5 |
| 6,686,108 B2 * | 2/2004 | Inoue et al. | 430/30 |

FOREIGN PATENT DOCUMENTS

| | | |
|---|---|---|
| JP | 2002-083757 | 3/2002 |
| JP | 2002-329783 | 11/2002 |

* cited by examiner

*Primary Examiner*—Jack Chiang
*Assistant Examiner*—Binh Tat
(74) *Attorney, Agent, or Firm*—Finnegan, Henderson, Farabow, Garrett & Dunner, L.L.P.

(57) ABSTRACT

A photo mask includes a mask pattern formed by using a mask exposure pattern to exposure a mask substrate, the mask exposure pattern being formed by adding a proximity effect correction pattern to a design pattern that is a pattern image of design data, the design pattern having a first portion extending in a first direction and a second portion extending in a second direction that is oblique to the first direction, the correction pattern having a first correction portion added to the first portion and a second correction portion added to the second portion, and an edge portion of the second correction portion being shaped to incline to extend in the first direction or a direction orthogonal to the first direction.

19 Claims, 3 Drawing Sheets

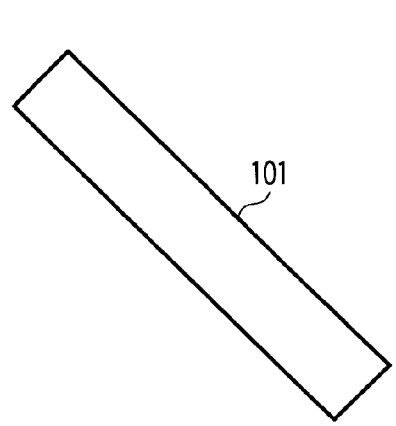
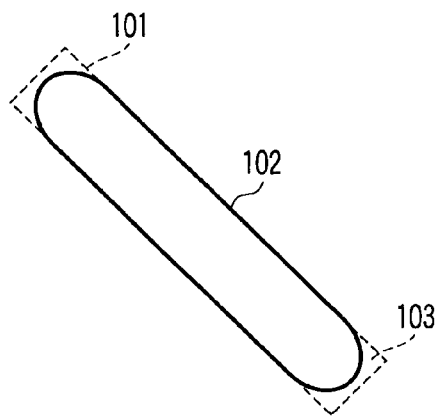
FIG. 1A  FIG. 1B
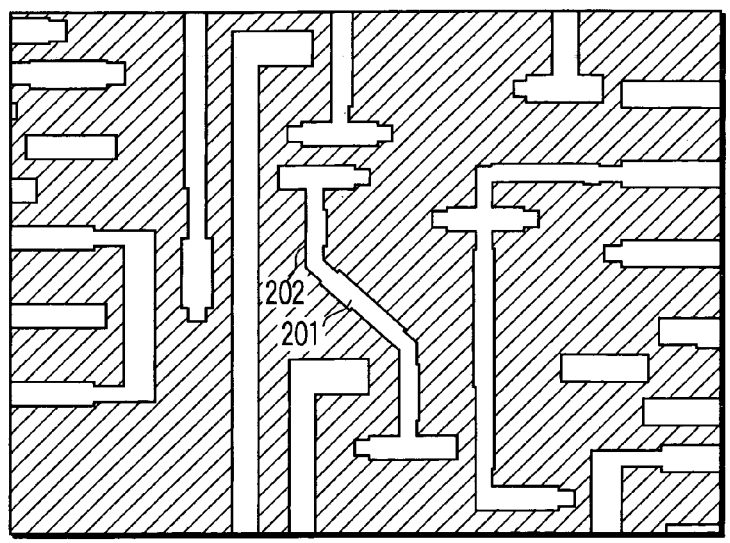
FIG. 2

PHOTO MASK, METHOD OF MANUFACTURING PHOTO MASK, AND METHOD OF GENERATING MASK DATA

CROSS-REFERENCE TO RELATED APPLICATIONS

This application is based upon and claims the benefit of priority from prior Japanese Patent Application No. 2003-168127, filed Jun. 12, 2003, the entire contents of which are incorporated herein by reference.

BACKGROUND OF THE INVENTION

1. Field of the Invention

The present invention relates to a photo mask used for exposure to form a pattern of a semiconductor device on the sample, and in particular, to a photo mask having an improved proximity effect correction pattern for an oblique line pattern, and a method of manufacturing the photo mask. The present invention also relates to a method of generating mask data used to manufacture a photo mask.

2. Description of the Related Art

In the prior art, a photo mask is used for light exposure in order to form a device pattern on a semiconductor wafer. The photo mask is produced using an electron beam lithography technique. The electron beam lithography technique uses electron beams to draw a design pattern of a semiconductor device on a mask substrate. A problem with the electron beam lithography technique is that when resolution is close to its limit, a proximity effect or the like may prevent an actual design pattern from being formed on a mask substrate. To solve this problem, a proximity effect correction pattern is added to the design pattern so as to accurately form a desired pattern (refer to, for example, Jpn. Pat. Appln. KOKAI Publication No. 2002-83757).

However, such a method has the problems described below. Since the proximity effect correction pattern is added to the design pattern, the number of figures used for shot divisions for electron beam drawing increases. This increases the time required for the drawing and the amount of data required. Consequently, data handling becomes difficult and other various problems may occur. Further, for example, fine figures that require a resolution higher than the one used may be generated at, for example, edges of the correction pattern. Thus, disadvantageously, these figures may not be resolved on the mask, the accuracy of defect inspections may decrease, or inspection throughput may decrease.

Further, when the pattern of the photo mask is transferred to a wafer by optical lithography, the optical proximity effect may curl edges of a pattern formed on the wafer or may thicken or thin the pattern. Consequently, the pattern formed on the pattern may differ from the original pattern. Thus, an OPC (Optical Proximity Correction) technique is required to add a correction pattern to the pattern to be formed on the photo mask in order to correct the optical proximity effect.

Accordingly, to more precisely create mask data for electron beam drawing, it is necessary to add, to a design pattern, both a correction pattern for correcting the proximity effect when the pattern is drawn on the photo mask, and a correction pattern for correcting the proximity effect when the pattern is transferred to the wafer. In this case, the above problems, including an increase in the number of figures and the generation of fine figures, are more significant.

Thus, in the prior art, when a correction pattern is added to a design pattern in order to correct the proximity effect, this may increase the number of figures required and thus the time required for drawing or may produce very fine figures that are not actually resolved. The increase in the time required for drawing may lead to a decrease in drawing throughput. The generation of fine figures may contribute to reducing the inspection throughput.

BRIEF SUMMARY OF THE INVENTION

According to a first aspect of the present invention, there is provided a photo mask comprising a mask pattern formed by using a mask exposure pattern to exposure a mask substrate, the mask exposure pattern being formed by adding a proximity effect correction pattern to a design pattern that is a pattern image of design data, the design pattern having a first portion extending in a first direction and a second portion extending in a second direction that is oblique to the first direction, the correction pattern having a first correction portion added to the first portion and a second correction portion added to the second portion, an edge portion of the second correction portion being shaped to incline to extend in the first direction or a direction orthogonal to the first direction.

According to a second aspect of the present invention, there is provided a method of manufacturing a photo mask, the method comprising forming a mask exposure pattern by adding a proximity effect correction pattern to a design pattern that is a pattern image of design data, the design pattern having a first portion extending in a first direction and a second portion extending in a second direction that is oblique to the first direction, the correction pattern having a first correction portion added to the first portion and a second correction portion added to the second portion, an edge portion of the second correction portion being shaped to incline to extend in the first direction or a direction orthogonal to the first direction, and forming a photo mask having a mask pattern by using the mask exposure pattern to expose a mask substrate.

According to a third aspect of the present invention, there is provided a method of generating mask data, the method comprising determining correction data used to correct a proximity effect and generating mask data used to form a photo mask by adding the correction data to design data, a design pattern of the design data having a first portion extending in a first direction and a second portion extending in a second direction that is oblique to the first direction, a correction pattern of the correction data having a first correction portion added to the first portion and a second correction portion added to the second portion, an edge portion of the second correction portion being shaped to incline to extend in the first direction or a direction orthogonal to the first direction.

According to a fourth aspect of the present invention, there is provided a photo mask having a mask pattern, the mask pattern having a design pattern that is a pattern image of design data and a proximity effect correction pattern to be added to the design pattern, the design pattern having a first portion extending in a first direction and a second portion extending in a second direction that is oblique to the first direction, the correction pattern having a first correction portion added to the first portion and a second correction portion added to the second portion, an edge portion of the second correction portion being shaped to incline to extend in the first direction or a direction orthogonal to the first direction.

BRIEF DESCRIPTION OF THE SEVERAL VIEWS OF THE DRAWING

FIG. 1A is a diagram showing a pattern image of design data to be formed on a photo mask according to an embodiment of the present invention;

FIG. 1B is a diagram showing a mask pattern obtained by forming the pattern of FIG. 1A on the mask;

FIG. 2 is a diagram showing a pattern image of mask data obtained as a result of pattern corrections based on an OPC process according to the embodiment of the present invention;

DETAILED DESCRIPTION OF THE INVENTION

Figure 3B:
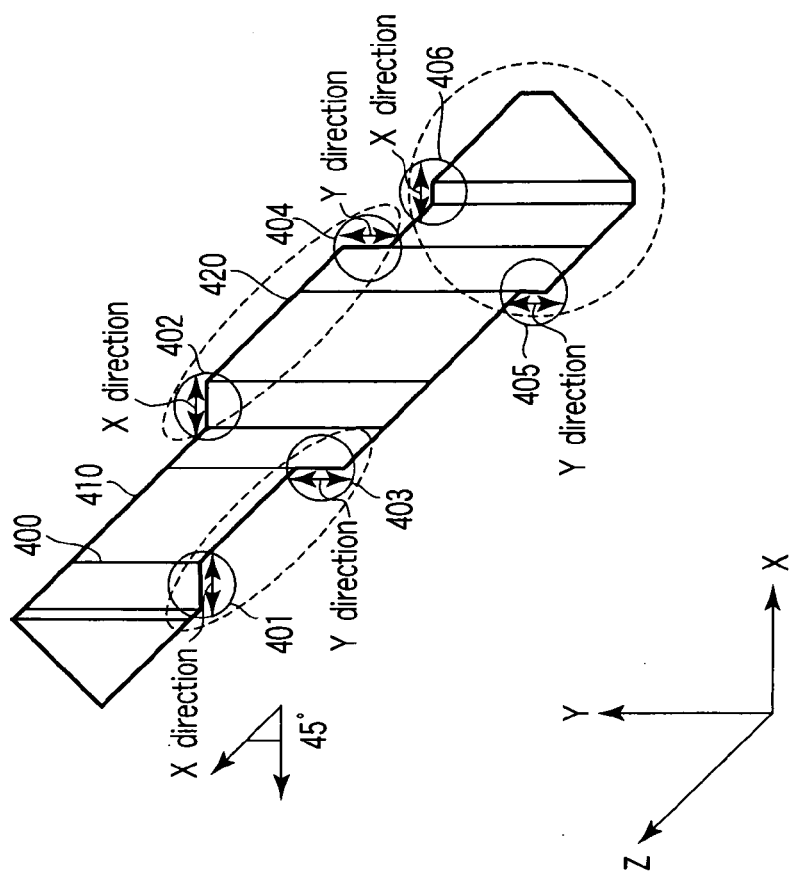
FIG. 3B is a diagram showing a pattern image obtained as a result of an OPC process using an oblique line pattern according to the embodiment of the present invention.

An embodiment of the present invention will be described with reference to the drawings.

The present embodiment relates to an OPC process of adding a proximity effect correction pattern to original figure data in design data used for an electron beam drawing apparatus that forms a desired pattern on a photo mask. In particular, the present embodiment relates to a method of forming a proximity effect correction pattern for an oblique line pattern. The term "OPC" as used herein means not only an optical proximity effect produced when a mask pattern is optically transferred to a sample but also a proximity effect produced when a mask exposure pattern is drawn on a mask substrate using electron beams.

FIG. 1A is a diagram showing a pattern image (design pattern) 101 of design data corresponding to an oblique line pattern to be formed on a photo mask. FIG. 1B is a diagram showing a mask pattern 102 produced by actually drawing the design pattern 101 such as the one shown in FIG. 1A. The shape of the mask pattern 102, formed on the mask, is ideally more similar to the shape of the design pattern 101.

The design pattern 101 is used to form the mask pattern 102 on the photo mask as described below. First, a resist is applied to a mask substrate composed of a glass substrate on which a light blocking film such as CR is formed. The electron beam drawing apparatus is used to draw the design pattern 101 on the resist on the basis of the design data on a semiconductor device (see FIG. 1A). Subsequently, the resist is developed to form a resist pattern. Then, the resist pattern is used as a mask to selectively etch the light blocking film by RIE or the like. In this manner, the mask pattern 102 for the photo mask is formed (see FIG. 1B).

Here, as shown in FIG. 1B, terminal portions 103 of the pattern are shorter than those of the actual design pattern 101 or their corners are curled. This is due to the proximity effect. To correct the proximity effect, it is necessary to pre-add a proximity effect correction pattern to the design pattern 101. The magnitude of the proximity effect is calculated through simulation on the basis of the design data, mask manufacture conditions, and a pattern arrangement (particularly the relationship between adjacent patterns).

FIG. 2 is a diagram showing a data image of a pattern portion on a photo mask subjected to pattern corrections based on an OPC process, that is, a pattern image (mask exposure pattern) of mask data.

As shown in FIG. 2, a correction pattern 202 is formed taking into account the proximity effect of adjacent patterns on a design pattern 201. As can be seen in FIG. 2, the correction pattern 202 may not only thicken but also thin the design pattern 201.

In the present embodiment, correction patterns similar to those in the prior art are used in an X direction (horizontal direction in the sheet of the drawing) and a Y direction (vertical direction in the sheet of the drawing). However, for an oblique line pattern extending in a direction (Z direction) orthogonal to the X and Y directions, the shape of the correction pattern is changed as described later.

Figure 3A:
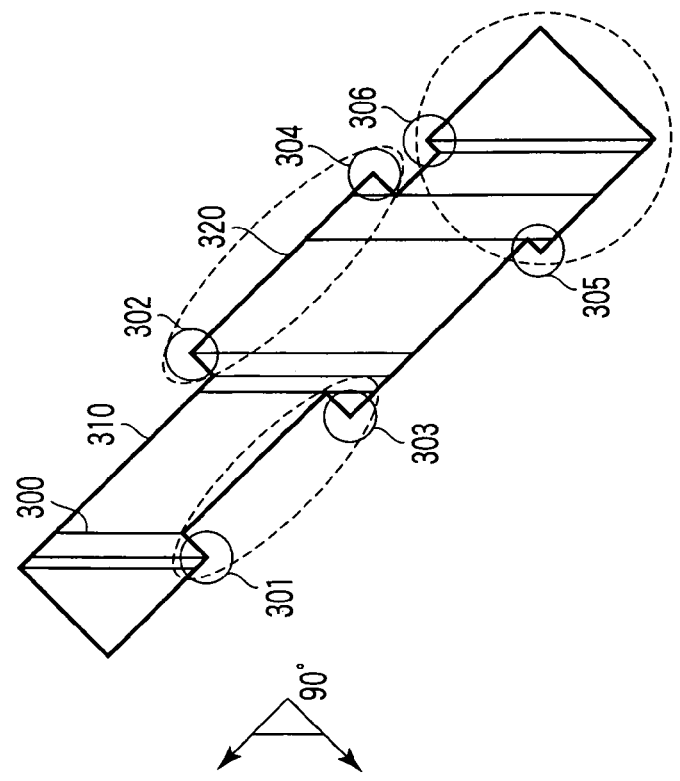
FIG. 3A is a diagram showing a pattern image obtained as a result of an OPC process using an oblique line pattern according to the prior art.

FIGS. 3A and 3B are enlarged views of one oblique line pattern in the design pattern. In this case, FIG. 3A shows a conventional OPC pattern (mask exposure pattern that is a pattern image of mask data) that has undergone proximity effect corrections when drawing data is created. FIG. 3B shows an OPC pattern (mask exposure pattern) according to the present embodiment. In the figures, reference numerals 310 and 410 denote design patterns, and reference numerals 320 and 420 denote proximity effect correction patterns.

In the conventional OPC process shown in FIG. 3A, edge portions of the correction pattern are formed perpendicular to the original data (design data). Solid lines 300 in the figure denote parting lines for the drawing data. The parting lines 300 are used to divide the drawing data into sets of data each of which can be drawn by the electron beam drawing apparatus in one shot. In the figures reference numerals 301 to 306 denote edge portions of the correction pattern, showing that fine figures are generated in portions 303 to 305. In the mask pattern actually formed on the photo mask, the pattern edge portions are curled.

In contrast, in the present embodiment, shown in FIG. 3B, edge portions 401 to 406 of the correction patters are formed to incline at 45° instead of 90°, which is used in the prior art, so as to be similar to a predicted image formed on the mask using the OPC pattern.

Specifically, in generating mask data in which the proximity effect on an oblique line pattern is corrected, the present embodiment executes a process of locally thickening or thinning the oblique line pattern in accordance with the distance between the target oblique line pattern portion and the adjacent pattern as well as the pattern coverage of a particular range. The thickening or thinning process uses a trapezoidal pattern that connects to a base pattern using X or Y axis parallel segments. In other words, the oblique line pattern portion is expressed by the angles of ±45° from an X and Y axes in a patter expression space and their combination. Moreover, in other words, the shape of the edge portions of the oblique line pattern is inclined so as to extend in the X direction or a direction (Y direction) perpendicular to the X direction.

In the figures, reference numerals 401 to 406 denote correction pattern portions in which the edge portions of the OPC pattern are formed of oblique line patterns inclining at 45°. A large number of oblique line patterns are present on the mask. However, the present embodiment is applicable to all the oblique line patterns. Solid lines 400 in the figure denote parting lines for the drawing data. Since the pattern edge portions are composed of the 45° oblique lines, the data parting lines lie at positions different from those of the parting lines in FIG. 3A. This eliminates the fine figures generated in the portions 303 to 305 in FIG. 3A. Consequently, the present embodiment can suppress the generation of fine figures at the edge portions of the correction pattern.

This improves pattern fidelity.

Further, a comparison of FIG. 3A with FIG. 3B indicates that the number of data sets into which the same pattern is divided decreases. This makes it possible to reduce the number of figures at the level of drawing data, that is, the amount of data required. Therefore, data handling is easy. The decrease in the number of fine figures serves to more appropriately match inspection data with an actual mask pattern during defect inspections. It is thus possible to increase the accuracy of defect inspections.

Figure 4:
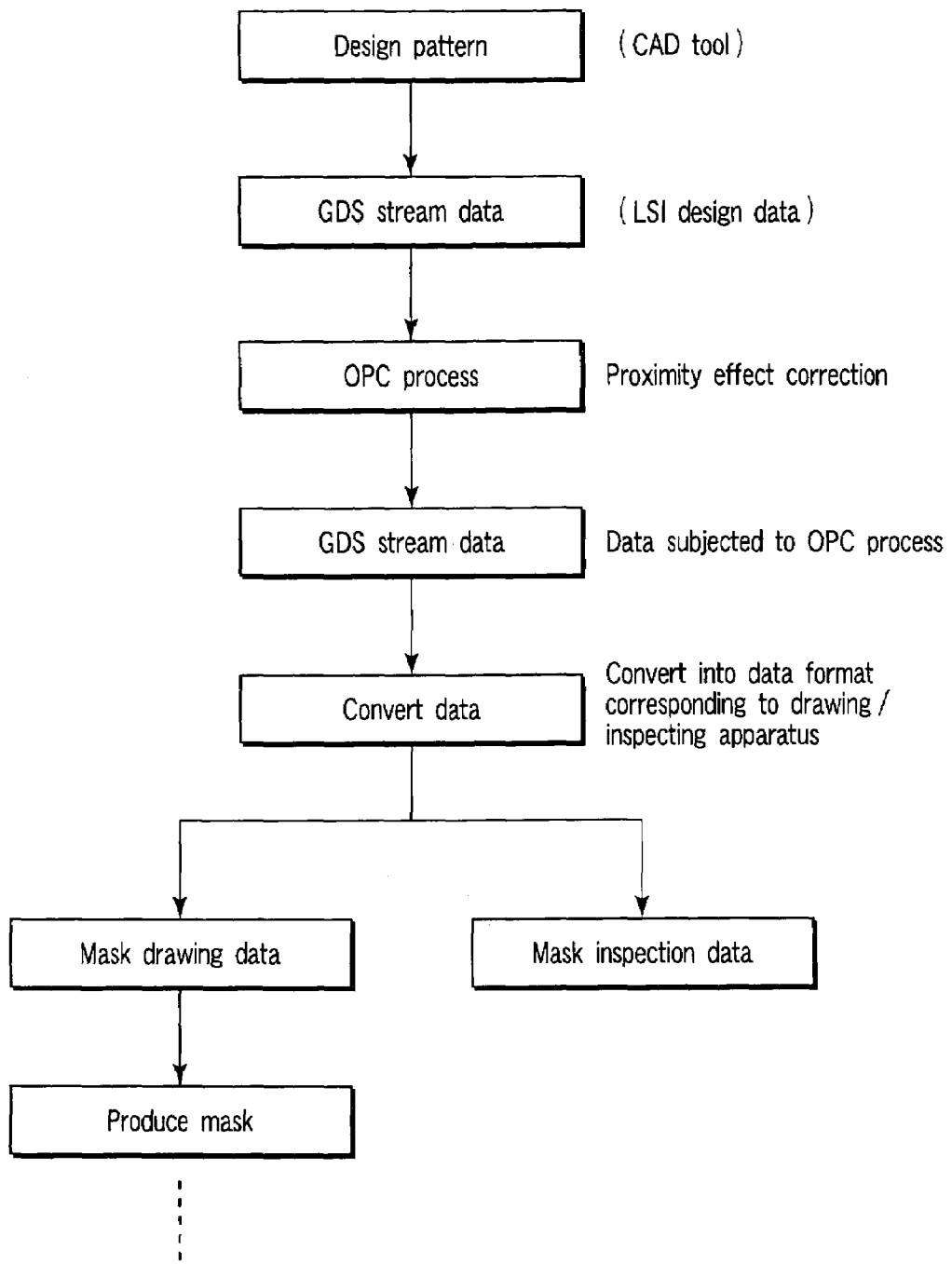
FIG. 4 is a diagram showing the flow of creation of mask data according to the embodiment of the present invention.

FIG. 4 is a diagram showing the flow of creation of mask data according to the present embodiment.

An OPC process for correcting the proximity effect is executed on LSI design data (GDS stream data) obtained by using a CAD tool to design a pattern. The OPC process comprises the addition of a correction data described above. The edge portions of the correction pattern added to the oblique line pattern are shaped like oblique lines inclining at 45° from the oblique lines in the design pattern. The data (GDS stream data) obtained by the OPC process is converted into a data format corresponding to a drawing/inspecting apparatus. Then, this data is used as mask drawing data to produce a mask. It is also used as mask inspection data in inspecting the mask pattern.

Thus, according to the present embodiment, when a proximity effect correction pattern is added to an oblique line pattern in a design pattern, the shape of the edge portions of the correction pattern is inclined at 45° to the oblique line portion of the design pattern as shown in FIG. 3B. This suppresses generation of fine figures resulting from the use of data parting lines for figure divisions. It is thus possible to suppress generation of fine figures possibly accompanying the OPC process and to reduce the number of figures required and thus the amount of data required. This contributes to improving the drawing throughput and the inspection throughput.

When the edge portions of a proximity effect correction pattern for an oblique line pattern are shaped like oblique lines inclining at 45° from the oblique line portion, the mask pattern has a shape similar to a predicted shape of a finished pattern. That is, since generation of fine figures is suppressed, mask data obtained according to the present embodiment is similar to a mask pattern actually formed on the mask. This makes it possible to more appropriately match defect inspection data with the actual shape of a mask pattern. Consequently, it is possible to increase the accuracy of defect inspections in inspecting a mask pattern for detects by comparing a design pattern image with a measured pattern image obtained by measuring the mask pattern.

As described above in detail, according to the present embodiment, the edge portions of a proximity effect correction pattern added to an oblique line portion of a design pattern are shaped like oblique lines. It is thus possible to suppress generation of fine figures possibly accompanying the process of correcting the proximity effect. It is also possible to reduce the number of figures required and thus the amount of data required. This contributes to, for example, improving the drawing throughput and the inspection throughput.

The present invention is not limited to the above embodiment. In the embodiment, in generating mask data, both first correction pattern and second correction data pattern are added to a design pattern; the first correction data corrects the proximity effect when the design pattern is drawn on a mask substrate using electron beams and the second correction pattern corrects the proximity effect when a mask pattern is optically transferred to a wafer (sample). However, the same results are obtained by adding only one of the correction patterns. For example, if the proximity effect attributed to the optical transfer is more marked than that attributed to the electron beam drawing, then as a mask pattern formed on a photo mask, it is only necessary to add a pattern for correcting the optical proximity effect to a design pattern based on design data.

Means for forming a mask pattern on a mask substrate is not limited to an electron beam drawing apparatus that draws a mask exposure pattern using electron beams. It is possible to use an ion beam drawing apparatus that draws a mask exposure pattern using ion beams. Moreover, the present invention is not necessarily limited to the direct drawing. A mask pattern can be formed using pattern transfer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photo mask comprising:
   a mask pattern formed by using a mask exposure pattern to expose a mask substrate,
   the mask exposure pattern being formed by adding a proximity effect correction pattern to a design pattern that is a pattern image of design data,
   the design pattern having a first portion extending in a first direction and a second portion extending in a second direction that is oblique to the first direction,
   the correction pattern having a first correction portion added to the first portion and a second correction portion added to the second portion,
   an edge portion of the second correction portion being shaped to incline to extend in the first direction or a direction orthogonal to the first direction.

2. The photo mask according to claim 1, wherein the mask pattern is formed by drawing the mask exposure pattern using electron beams.

3. The photo mask according to claim 1, wherein the first direction and the second direction are relatively inclined at 45° from each other.

4. The photo mask according to claim 1, wherein the correction pattern is obtained by synthesizing a first correction pattern with a second correction pattern,
   the first correction pattern is used to correct a first proximity effect produced when the design pattern is used to expose the mask substrate, and
   the second correction pattern is used to correct a second proximity effect produced when the mask pattern is used to expose a wafer.

5. The photo mask according to claim 4, wherein the first proximity effect is produced when the design pattern is drawn on the mask substrate using electron beams.

6. The photo mask according to claim 4, wherein the second proximity effect is produced when the mask pattern is optically transferred to the wafer.

7. A method of manufacturing a photo mask, the method comprising:
   forming a mask exposure pattern by adding a proximity effect correction pattern to a design pattern that is a pattern image of design data, the design pattern having a first portion extending in a first direction and a second portion extending in a second direction that is oblique to the first direction, the correction pattern having a first correction portion added to the first portion and a second correction portion added to the second portion, an edge portion of the second correction portion being shaped to incline to extend in the first direction or a direction orthogonal to the first direction, and forming a photo mask having a mask pattern by using the mask exposure pattern to expose a mask substrate.

8. The method of manufacturing a photo mask according to claim 7, wherein in forming the photo mask, the mask pattern is formed by drawing the mask exposure pattern using electron beams.

9. The method of manufacturing a photo mask according to claim 7, wherein the first direction and the second direction are relatively inclined at 45° from each other.

10. The method of manufacturing a photo mask according to claim 7, wherein the correction pattern is obtained by synthesizing a first correction pattern with a second correction pattern, the first correction pattern is used to correct a first proximity effect produced when the design pattern is used to expose the mask substrate, and the second correction pattern is used to correct a second proximity effect produced when the mask pattern is used to expose a wafer.

11. The method of manufacturing a photo mask according to claim 10, wherein the first proximity effect is produced when the design pattern is drawn on the mask substrate using electron beams.

12. The method of manufacturing a photo mask according to claim 10, wherein the second proximity effect is produced when the mask pattern is optically transferred to the wafer.

13. A method of generating mask data, the method comprising:

determining correction data used to correct a proximity effect; and generating mask data used to form a photo mask by adding the correction data to design data, a design pattern of the design data having a first portion extending in a first direction and a second portion extending in a second direction that is oblique to the first direction, a correction pattern of the correction data having a first correction portion added to the first portion and a second correction portion added to the second portion, an edge portion of the second correction portion being shaped to incline to extend in the first direction or a direction orthogonal to the first direction.

14. The method of generating mask data according to claim 13, wherein the correction data has:

first correction data used to correct a proximity effect produced when the design pattern is used to expose the mask substrate, second correction data used to correct a proximity effect produced when a mask pattern formed on the photo mask is used to expose a wafer, and the correction pattern is obtained by synthesizing the first correction data with the second correction data.

15. The method of generating mask data according to claim 14, wherein the exposure of the mask substrate is electron beam drawing.

16. The method of generating mask data according to claim 14, wherein the exposure of the wafer is optical transfer.

17. The method of generating mask data according to claim 14, wherein the first direction and the second direction are relatively inclined at 45° from each other.

18. A photo mask comprising:

a mask pattern having a design pattern that is a pattern image of design data and a proximity effect correction pattern to be added to the design pattern, the design pattern having a first portion extending in a first direction and a second portion extending in a second direction that is oblique to the first direction, the correction pattern having a first correction portion added to the first portion and a second correction portion added to the second portion, an edge portion of the second correction portion being shaped to incline to extend in the first direction or a direction orthogonal to the first direction.

19. The photo mask according to claim 18, wherein the first direction and the second direction are relatively inclined at 45° from each other.

* * * * *